United States Patent [19]

Barrett

[11] Patent Number: 4,682,032
[45] Date of Patent: Jul. 21, 1987

[54] JOULE-THOMSON CRYOSTAT HAVING A CHEMICALLY-DEPOSITED INFRARED DETECTOR AND METHOD OF MANUFACTURE

[75] Inventor: John R. Barrett, Wayland, Mass.
[73] Assignee: Itek Corporation, Lexington, Mass.
[21] Appl. No.: 819,576
[22] Filed: Jan. 17, 1986
[51] Int. Cl.$^4$ .................. G01J 5/04; H01L 23/34
[52] U.S. Cl. ................. 250/352; 62/514 IT; 250/370; 357/83
[58] Field of Search ............ 250/352, 370 L, 338 SE, 250/370 G, 370 J; 62/514 JT, 514 R; 357/83

[56] References Cited

U.S. PATENT DOCUMENTS

| | | | |
|---|---|---|---|
| 4,321,615 | 3/1982 | Blackman et al. | 357/30 |
| 4,386,505 | 6/1983 | Little | 62/514 R |
| 4,488,414 | 12/1984 | Jungkman et al. | 62/514 R |
| 4,591,717 | 5/1986 | Scherber | 250/338 |
| 4,602,158 | 7/1986 | Barrett | 250/338 |

OTHER PUBLICATIONS

R. B. Schoolar, J. D. Jensen and G. M. Black, "Composition-Tuned PbS$_x$Se$_{1-x}$ Schottky-Barrier Infrared Detectors" *Applied Physics Letters*, vol. 31, No. 9, (Nov. 1977), pp. 620-622.

Robert M. Duboc, Jr., and Dr. Robert Wolfe, "Small Wonders: Microminiature Refrigerators for Cooling Detectors, *Photonics Spectra* (Jul. 1983).

*Primary Examiner*—Janice A. Howell
*Assistant Examiner*—Constantine Hannaker
*Attorney, Agent, or Firm*—Michael H. Wallach; Robert F. Rotella

[57] ABSTRACT

An infrared photodetector is disclosed which is deposited directly onto a Joule-Thomson cryostat. The cryostat includes an elongated body having gas-carrying channels contained therein. The photodetector is deposited directly onto one end of the elongated body to form a direct thermal path between the detector and cryostat, thereby eliminating the need for any intermediate thermal bridge such as a mechanical bond, thermal conductive paste or epoxy. The direct contact between the photodetector material and the cryostat reduces the thermal mass of the structure to be cooled by the cryostat, thereby decreasing both the time and the quantity of gas required to cool the detector.

17 Claims, 2 Drawing Figures

JOULE-THOMSON CRYOSTAT HAVING A CHEMICALLY-DEPOSITED INFRARED DETECTOR AND METHOD OF MANUFACTURE

BACKGROUND OF THE INVENTION

1. Field of the Invention

This invention relates generally to infrared detectors and more particularly to infrared detectors which are integrally deposited on a Joule-Thomson cryostat to permit efficient cooling of the detectors.

2. Summary of the Prior Art

It has long been known that the detectivity of an infrared detector can be improved by cooling the detector with a Joule-Thomson cryostat. Prior-known Joule-Thomson cryostat-cooled infrared detectors have principally relied upon either mechanical bonds or bridges, or upon cement or other thermally-conductive bonds to conduct heat away from infrared detectors which have been separately fabricated and then fastened to the cryostat. The conduction of heat away from the detector has, therefore, required that an efficient thermal bond be established between the detector and the body of the cryostat.

Infrared detectors are now being considered for use in an increasing variety of munitions, such as shells and bombs, which require the detector to operate at optimum efficiency while subject to severe stress and vibration during the launch and flight of the projectile. The detectors must be capable of being cooled down in as brief a period of time as possible, which requires that the thermal mass of the detector and its supporting structure be kept to a minimum since any additional mass which must be cooled by the cryostat will increase the time required to cool down the detector. Furthermore, if the mechanical bond between the infrared detector and its cryostat-cooler either fails or does not form an efficient thermal path, the successful completion of the munition's mission would be jeopardized. Therefore, it is especially important that detectors used in connection with munitions be designed such that the potential for any failure of the bond of the detector to a cryostat-cooler is minimized.

One problem with prior-known Joule-Thomson cooled infrared detectors in which the detector is separately mounted on the cryostat is that the bond between the detector and the cryostat must be carefully designed to insure an efficient path for the transfer of heat from the detector to the cryostat.

Another problem with infrared detectors which are mechanically fastened to Joule-Thomson cryostats is that the detector must be physically handled while being fastened to the cryostat, which introduces the potential for physically damaging the detector.

Yet another problem with detectors which have been separately fabricated and then bonded to Joule-Thomson cryostats is that the detector is subject to premature failure or inefficient operation if the mechanical bond between the cryostat and the detector is not properly made.

Still another problem with some prior-known Joule-Thomson cooled detectors is that the heat must be conducted away from the detector over a long mechanical path which requires that the Joule-Thomson cryostat operate over an appreciable length of time to ensure that the detector is sufficiently cooled, thereby requiring an additional supply of cooling gas.

SUMMARY OF THE INVENTION

A primary object of the invention is to provide a Joule-Thomson cryostat having a chemically-deposited infrared detector which may be rapidly cooled down using a minimum quantity of cooling gas.

Another object of the invention is to provide a Joule-Thomson cooled infrared detector in which the possibility of the failure of the mechanical bond forming the path for the conduction of thermal energy between the infrared detector and the cryostat is minimized.

Still another object of the invention is to provide a Joule-Thomson cooled infrared detector which is easy to fabricate.

A further object of the invention is to provide a Joule-Thomson cooled infrared detector in which the detector and cooler are small in size and lightweight, thereby making them useful in munitions such as shells and small missiles.

The above and other objects and advantages are achieved by taking advantage of the Joule-Thomson cooling effect in which a gas, for example nitrogen, under high pressure, is passed through a small diameter bore tube and then is allowed to expand through an orifice. The reduction in pressure experienced by the gas as it expands is accompanied by the loss of heat. The gas liquefies as it gives up heat and the liquid coolant is available to absorb heat from a component to be cooled. The Joule-Thomson effect may be implemented in a substrate which has a number of gas-carrying channels formed therein for receiving and circulating a gas, for example nitrogen, therethrough, to cool the substrate. The invention discloses the deposition of an infrared detector directly onto a substrate which has gas-carrying channels formed therein by utilizing the following steps:

The substrate is cleaned and metallized and an array of contacts are etched in the metallized layer. One or more layers of photodetector material, such as lead sulfide or lead selenide, are chemically deposited over the metallized layer. Preferably thereafter a photodetector pattern may be delineated in the layer of photodetector material. The Joule-Thomson cooled photodetector is preferably mounted within a vacuum package to isolate the cooler from the ambient atmosphere. The Joule-Thomson cooled photodetector described herein is operated by connecting the substrate to a supply of pressurized cooling gas. The gas circulates through the cooler and cools the substrate on which the photodetector has been deposited by taking advantage of the Joule-Thomson effect, thereby avoiding the need for an intermediate thermal bond between the cooler and the photodetector.

BRIEF DESCRIPTION OF THE DRAWINGS

The disclosed invention may be readily understood by an examination of the detailed description of a preferred embodiment of the invention when read in conjunction with the following drawings in which.

DETAILED DESCRIPTION OF A PREFERRED EMBODIMENT

Figure 1:
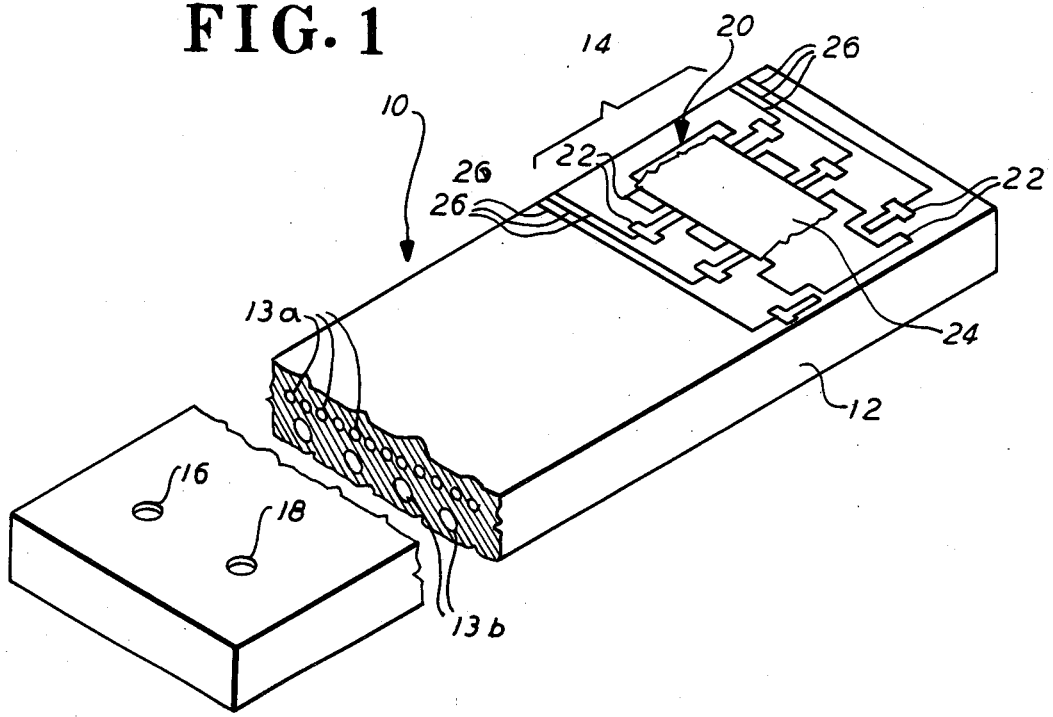
FIG. 1 is a perspective view partially in section of a Joule-Thomson cryostat having a photodetector deposited on one portion thereof.

Referring to the drawings, FIG. 1 shows a perspective view, partially in section, of a Joule-Thomson cryostat, shown generally at 10, incorporating thereon the teachings of the invention. A representative Joule-Thomson cryostat which may be successfully used to carry out the teachings of this invention is manufactured and sold by MMR Technologies, Inc., Mountain View, Calif. as its "System I" nitrogen gas microminiature refrigerator. The cryostat 10 includes an elongated planar body 12, having a plurality of coolant-conducting channels, representative ones of which are shown within the body 12 at 13a and 13b. The body 12 has an area 14 located at one end thereof on which may be mounted a photodetector for conductive cooling by the cryostat. The body 12 also includes an inlet port 16 and an outlet port 18 through which, respectively, a coolant such as a gas may be directed into and away from the channels 13a and 13b contained within the body 12. A detailed description of the operation of a Joule-Thomson cryostat may be had by reference to the article entitled "Small Wonders: Microminiature Refrigerators for Cooling Detectors" which appeared in the July, 1983 issue of *Photonics Spectra,* copyright 1983 by The Optical Publishing Co., the teachings of which are incorporated herein by reference. Cryostats of the type shown in FIG. 1 are well known in the art and may be used to cool infrared detectors which are retained against the body 12 by the use of thermally conductive epoxy or thermally conductive grease to reduce the thermal resistance between the cryostat and the detector. It will be appreciated by one skilled in the art that the time and quantity of cooling gas required to cool a photodetector may be appreciably reduced by reducing the mass of the photodetector and the supporting structure with which it is in thermal contact and by increasing the thermal conductivity between the photodetector and the cryostat. The invention disclosed herein achieves the foregoing reduction in cooling time and gas by depositing the photodetector directly on the body 12, thereby eliminating the need for any intermediary epoxy, conductive paste, or mechanical restraint for thermally bonding the photodetector to the cryostat.

A lead sulfide (PbS) infrared detector such as that as shown generally at 20, which is suitable for detecting infrared radiation in the 1 to 3.5 micrometer range may be deposited on the body 12 using the following representative technique. The substrate 12, and especially the area 14, are first cleaned to remove all foreign material therefrom. Preferably the cleaning is carried out by immersing the body 12 in a warm (approximately 60° C.) bath of nitric acid for a period of approximately fifteen minutes. The body is then rinsed with several baths of clean water and soaked in a one percent solution of ammonium hydroxide for four hours to remove all traces of acid. The body 12 is then again rinsed several times using clean water.

After cleaning, the area 14 of the substrate has a 2,000 angstrom thick layer of metal, preferably comprised of a 300 angstrom thick layer of chromium, followed by a 1,700 angstrom thick layer of gold deposited thereon. A layer of photoresist is deposited on top of the metallized layer and the photoresist is photolithographically exposed and then developed using well-known photolithography techniques to delineate a pattern of electrodes 22 in the metallized layer. Thereafter, the remainder of the photoresist (the unexposed portion) is stripped away in any conventional, well-known manner.

A layer of lead sulfide detector material 24 is deposited over the electrodes 22 by forming a solution containing a lead thiourea complex that is decomposed by a base catalyzed reaction. The solution is prepared by adding 0.9 moles of aqueous sodium hydroxide (NaOH) to 0.2 moles of aqueous lead acetate $(Pb[C_2H_3O_2]_2.3\text{-}H_2O)$. Then, 0.2 moles of aqueous thiourea $([NH_2]_2 CS)$ and 0.1 moles of aqueous hydrogen peroxide $(H_2O_2)$ are added and the temperature of the starting solution is adjusted to 20° C. The deposition is carried out over a rising temperature of 20° to 60° C. Several coats are sequentially deposited over each other to form the lead sulfide active layer. The detector material is sensitized by baking in air at a temperature of approximately 100° C. for one or more hours.

The last step in preparing the detector involves delineating a detector pattern on the deposited detector material, which is accomplished by applying a positive photoresist over the layer of photodetector material. A photographic mask, having a photodetector pattern contained thereon, is used to selectively expose the layer of photoresist in a well-known manner. The resulting pattern in the photoresist is developed using any known process compatible with the photoresist used. The photodetector layer is thereafter etched in concentrated hydrochloric acid to delineate the active areas. After etching, the photoresist is stripped away by immersion in an acetone bath.

The detector may be connected to an external circuit via the leads 26 which are bonded to the electrodes 22.

While a lead-sulfide infrared detector has been described as being suitable for direct deposition on the substrate 12, it is to be understood that any depositable detector material, such as the detector described in my copending U.S. patent application Ser. No. 665,271 filed Oct. 26, 1984, now U.S. Pat. No. 4,602,158, dated July 22, 1986 the teachings of which are incorporated herein, may be used without departing from the spirit or scope of my invention.

Figure 2:
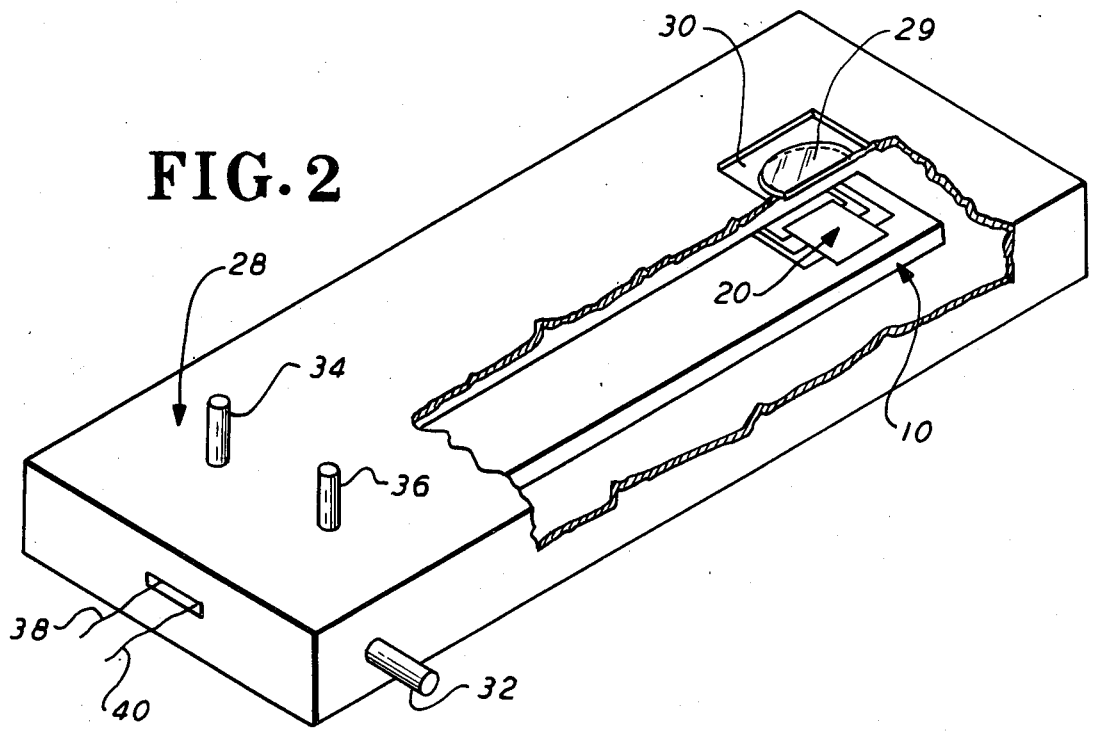
FIG. 2 is a view of the photodetector shown in FIG. 1 mounted in a vacuum chamber.

FIG. 2 shows a cryostat 10 having a detector 20 deposited thereon which has been preferably mounted within a vacuum chamber 28. The chamber 28 includes an aperture 29 which is sealed with an optical window 30 through which infrared radiation may pass with little or no attenuation to strike the surface of the detector 20. The vacuum chamber 28 includes an exhaust line 32 to permit the chamber to be evacuated, a port 34 to permit gas for cooling the Joule-Thomson cooler 10 to be introduced, and a port 36 to permit coolant to be removed after it has passed through the cooler 10. Signals from the detector are led via the lines 38, 40 to any appropriate electronic systems suitable for processing the output of the photodetector.

The detector is operated by evacuating all gases from the chamber 28 via the line 32 which, for the purpose, is connected to a standard vacuum pump (not shown). Thereafter, gas, for example nitrogen, is introduced into the cryostat 10 via the port 34. The gas flows through the channels 13a and is removed from the cryostat 10 and out of the chamber 28 through lines 13b and the port 36. Infrared radiation to be sampled by the detector passes through the window 30 and strikes the detector which produces a signal related to the intensity of the incident infrared radiation. The signal may be analyzed by connecting instruments to the lines 38, 40.

While one preferred example for depositing a detector on a Joule-Thomson cryostat has been disclosed, it is to be understood that other methods may be used which still fall within the scope of the invention. For example, the detector may be deposited on the body 12 of the cryostat by first depositing a layer of detector material, such as lead selenide, then delineating a pattern in the detector material by, for example, the use of photolithography techniques. Thereafter, a metallized layer may be deposited over the detector material and the metallized layer delineated to form the lead selenide active areas by the use of photolithography. Alternatively, the metal layer may be delineated by thermal vacuum deposition of the metallized layer using a delineated mask to control the locations at which the metal is deposited. The foregoing are intended to be merely illustrative of the modifications which may be made within the scope of the invention and the invention is only intended to be limited by the scope of the appended claims.

I claim:

1. In combination with a Joule-Thomson cryostat having an elongated substrate with gas-carrying channels formed therein, an infrared detector chemically deposited directly on said substrate, such that said infrared detector is cooled by a gas flowing through the channels of said substrate.

2. The combination set forth in claim 1 wherein said infrared detector is comprised of lead sulfide.

3. The combination set forth in claim 2 wherein said infrared detector is deposited on an area located at one end of said substrate.

4. The combination set forth in claim 2 wherein said substrate is cooled by nitrogen gas.

5. The combination set forth in claim 4 wherein said Joule-Thomson cryostat is encased in a vacuum chamber.

6. A method for fabricating an infrared detector on a Joule-Thomson cryostat having a substrate, said method including the steps of:
    (a) depositing a layer of metal on one side of said substrate;
    (b) delineating said layer of metal into a pattern of electrodes;
    (c) chemically depositing one or more layers of infrared sensitive detector material directly on said pattern of electrodes; and
    (d) sensitizing said one or more layers of detector material to enhance the sensitivity of said detector material to infrared radiation.

7. The method set forth in claim 6 further including the step of cleaning said substrate prior to depositing said layer of metal.

8. The method set forth in claim 7 wherein said step of cleaning includes immersing said substrate in concentrated nitric acid.

9. The method set forth in claim 6 wherein said layer of metal is comprised of a layer of chromium and a layer of gold deposited on top of said layer of chromium.

10. The method set forth in claim 6 wherein said layer of metal is delineated by the process of photolithography.

11. The method set forth in claim 6 wherein said layer of detector material is sensitized by baking said material after it has been deposited on said cryostat.

12. A Joule-Thomson cooled photodetector comprised of:
    (a) a substrate having gas-carrying channels formed therein, said substrate including an inlet port for introducing gas into said channels and an outlet port for allowing gas to exit from said channels;
    (b) a photodetector comprised of a photodetector material chemically deposited directly on said substrate, said photodetector material producing an electrical signal when exposed to optical radiation;
    (c) a vacuum chamber enclosing said substrate, said vacuum chamber including an optical window which allows optical radiation of at least the frequency to which said photodetector material is sensitive to pass into said vacuum chamber and strike said photodetector material; and
    (d) a supply of gas, said supply of gas being connected to said inlet port on said substrate for supplying gas to said substrate.

13. The arrangement set forth in claim 12 wherein said supply of gas is nitrogen.

14. The arrangement set forth in claim 13 wherein said detector material is lead selenide.

15. The arrangement set forth in claim 13 wherein said substrate is manufactured from glass.

16. The arrangement set forth in claim 12 wherein said photodetector material is lead sulfide.

17. The arrangement set forth in claim 16 wherein said photodetector material is deposited on an area located at one end of said substrate.

* * * * *